United States Patent
Nerreter

(10) Patent No.: US 6,525,537 B2
(45) Date of Patent: Feb. 25, 2003

(54) MAGNETIC RESONANCE APPARATUS HAVING A SINGLE-CIRCUIT COOLING CIRCULATION SYSTEM

(75) Inventor: Ulrich Nerreter, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/746,259

(22) Filed: Dec. 21, 2000

(65) Prior Publication Data

US 2001/0019266 A1 Sep. 6, 2001

(30) Foreign Application Priority Data

Dec. 22, 1999  (DE) ......................................... 199 62 182

(51) Int. Cl.[7] ............................................... G01V 3/00
(52) U.S. Cl. ...................................... 324/322; 324/318
(58) Field of Search ................................ 324/322, 318, 324/321, 320, 307, 309

(56) References Cited

U.S. PATENT DOCUMENTS

| 4,437,053 | A | * | 3/1984 | Bax | 323/268 |
|---|---|---|---|---|---|
| 4,652,824 | A | * | 3/1987 | Oppelt | 324/318 |
| 5,329,266 | A | * | 7/1994 | Soeldner et al. | 335/216 |
| 5,412,363 | A | * | 5/1995 | Breneman et al. | 335/216 |
| 5,489,848 | A | * | 2/1996 | Furukawa | 324/318 |
| 5,513,498 | A | * | 5/1996 | Ackermann et al. | 62/51.1 |
| 5,602,477 | A | * | 2/1997 | McCarthy et al. | 324/315 |
| 5,652,517 | A |   | 7/1997 | Maki et al. |   |
| 6,043,653 | A | * | 3/2000 | Takamori et al. | 324/300 |
| 6,111,412 | A |   | 8/2000 | Boemmel et al. |   |

FOREIGN PATENT DOCUMENTS

DE    197 21 985    12/1998

* cited by examiner

Primary Examiner—Edward Lefkowitz
Assistant Examiner—Dixomara Vargas
(74) Attorney, Agent, or Firm—Schiff Hardin & Waite

(57) ABSTRACT

A magnetic resonance apparatus having a single-circuit cooling circulation system operated with a coolant for cooling a gradient coil system so that a temperature of at least one surface of the gradient coil system remains within a prescribable temperature range. The cooling circulation system has a performance that corresponds to the average ohmic dissipated power of the gradient coil system, contains a heat exchanger that can be at least switched on and off and exhibits a high-frequency on/off switching clock. The gradient system exhibits a high average specific heat capacity and the cooling fluid exhibits an operating temperature range that proceeds beyond the prescribable temperature range.

11 Claims, 4 Drawing Sheets

MAGNETIC RESONANCE APPARATUS HAVING A SINGLE-CIRCUIT COOLING CIRCULATION SYSTEM

BACKGROUND OF THE INVENTION

The present invention is directed to a magnetic resonance apparatus with a single-circuit cooling circulation system operated with a coolant for cooling a gradient coil system, so that the temperature of at least one surface of the gradient coil system remains within a prescribable temperature range.

Given an embodiment of a magnetic resonance apparatus, such as a tomography apparatus, rapidly switched gradient fields that are generated by a gradient coil system are superimposed on a static basic magnetic field that is generated by a basic field magnet. Usually, the gradient coil system comprises a plurality of gradient coils in order to generate three magnetic field gradients that reside perpendicularly to one another. Given the actively shielded gradient coil systems that are often utilized at present, gradient coils, that prevent eddy currents from being generated in metallic parts of the basic field magnet that surrounds the gradient coil system, are present in addition to what are referred to as "primary coils" that generate a payload gradient field.

Typically, the gradient coil system is permeated by a pulse-shaped current. The currents thereby reach amplitude values up to several 50 A and are subject to frequent and rapid changes of the current direction with rise and decay rates of several 50 kA/s. Due to the ohmic impedance of the gradient coil system, the afore-mentioned currents convert a substantial energy quantity into heat. In order to maintain a complete performance capability of the gradient coil system and/or in order to prevent an unpleasant heating for a patient supported in the apparatus, the heat is eliminated in a suitable way and manner. To that end, the gradient coil system comprises, for example, a plurality of cooling channels through which a coolant is conducted.

In one embodiment, the basic field magnet is fashioned as a permanent magnet. A stable basic magnetic field is thereby a prerequisite for a high quality of magnetic resonance images. In order to reduce basic magnetic field fluctuations as a consequence of temperature fluctuations of the permanent magnet, the permanent magnet must be operated with a corresponding temperature stability. To that end, the permanent magnet is held at a working temperature of, for example, 32° C. with great outlay for insulation and control. Since the gradient coil system is arranged directly or in the immediate proximity of the permanent magnet, any heating by the gradient coil system as a result of operation should only vary the working temperature of the permanent magnet within very narrow limits. For example, it must thereby be assured that the working temperature remains within a temperature band whose width is predetermined, for example, in that center frequencies of magnetic resonance signals which are registered at the time spacing of ten minutes do not deviate from one another by more than 20 Hz.

Given a magnetic resonance apparatus having an electrically normally conducting basic field magnet, the heat of the basic field magnet developed during operation as well as the gradient coil system are, respectively, eliminated via secondary fluid coolant circulation. Both secondary fluid cooling circulation systems thereby emit their heat in an intermediate heat exchanger to a primary fluid cooling circulation system. This contains a further heat exchanger constructed at the outside for outputting its heat to the ambient air. In particular, the intermediate heat exchanger and the heat exchanger constructed on the outside are responsible for the fact that the overall cooling system is complicated and is expensive.

SUMMARY OF THE INVENTION

It is, therefore, an object of the present invention to create a magnetic resonance apparatus which has a cooling circulation system for a gradient coil system that meets the demands made of a permanent basic field magnet and avoids the afore-mentioned disadvantages of the prior art.

This object is inventively achieved by a magnetic resonance apparatus having a single-circuit cooling circulation system operated with a coolant for cooling a gradient coil system so that a temperature of at least one surface of the gradient coil system remains within a prescribable temperature range.

The inventive magnetic resonance apparatus having the single-circuit cooling circulation system operated with a coolant for cooling a gradient coil system comprises the following features:

a dimensioning performance of the cooling circulation system corresponds to an average ohmic dissipated power of the gradient coil system;

the cooling circulation system contains at least one heat exchanger that can be turned on and off;

the heat exchanger includes a high-frequency on/off switching clock;

the gradient coil system comprises a high average specific heat capacity; and the coolant comprises an operating temperature range that proceeds beyond the prescribable temperature range.

Upon utilization of a high average specific heat capacity of the gradient coil system that is often already present, an extremely cost-beneficial cooling circulation system can be implemented that assures that a temperature of at least one surface of the gradient coil system remains within a prescribable temperature.

In an advantageous development, the on/off switching clock has a frequency of less than approximately ten minutes.

In another advantageous development, the average specific heat capacity is greater than approximately 1 J/gK. The average specific heat capacity is thereby formed of the specific heat capacities of the materials utilized in the gradient coil system in conformity with their mass parts. In particular, a high specific heat capacity of the material is thereby advantageous that surrounds conductors of the gradient coil system for the purpose of electrical insulation and/or mechanical strength. In many embodiments, this material is a casting resin that intrinsically comprises a high specific heat capacity.

In an advantageous development, the heat exchanger is an air-cooled heat exchanger for interior construction. In particular, the heat exchanger dimensioned for interior construction exhibits clear cost advantages over a heat exchanger for exterior construction.

In an advantageous development, the magnetic resonance apparatus contains the following additional feature:

the cooling circulation contains a temperature sensor for determining a run-up temperature;

the cooling circulation system contains a two-point regulator whose manipulated quantity is the run-up temperature and whose actuating quantity regulates the on/off switching of the heat exchanger; and the two-point regulator comprises a low switching difference for achieving a high-frequency on/off switching clock.

As a result thereof, the high-frequency on/off switching clock can be generated and regulated with a simple and cost-beneficial two-point regulator as well as with a simple acquisition of the run-up temperature.

Other advantages and features of the invention will be readily apparent from the following description of the preferred embodiments, the drawings and claims.

DESCRIPTION OF THE PREFERRED EMBODIMENTS

Figure 1:
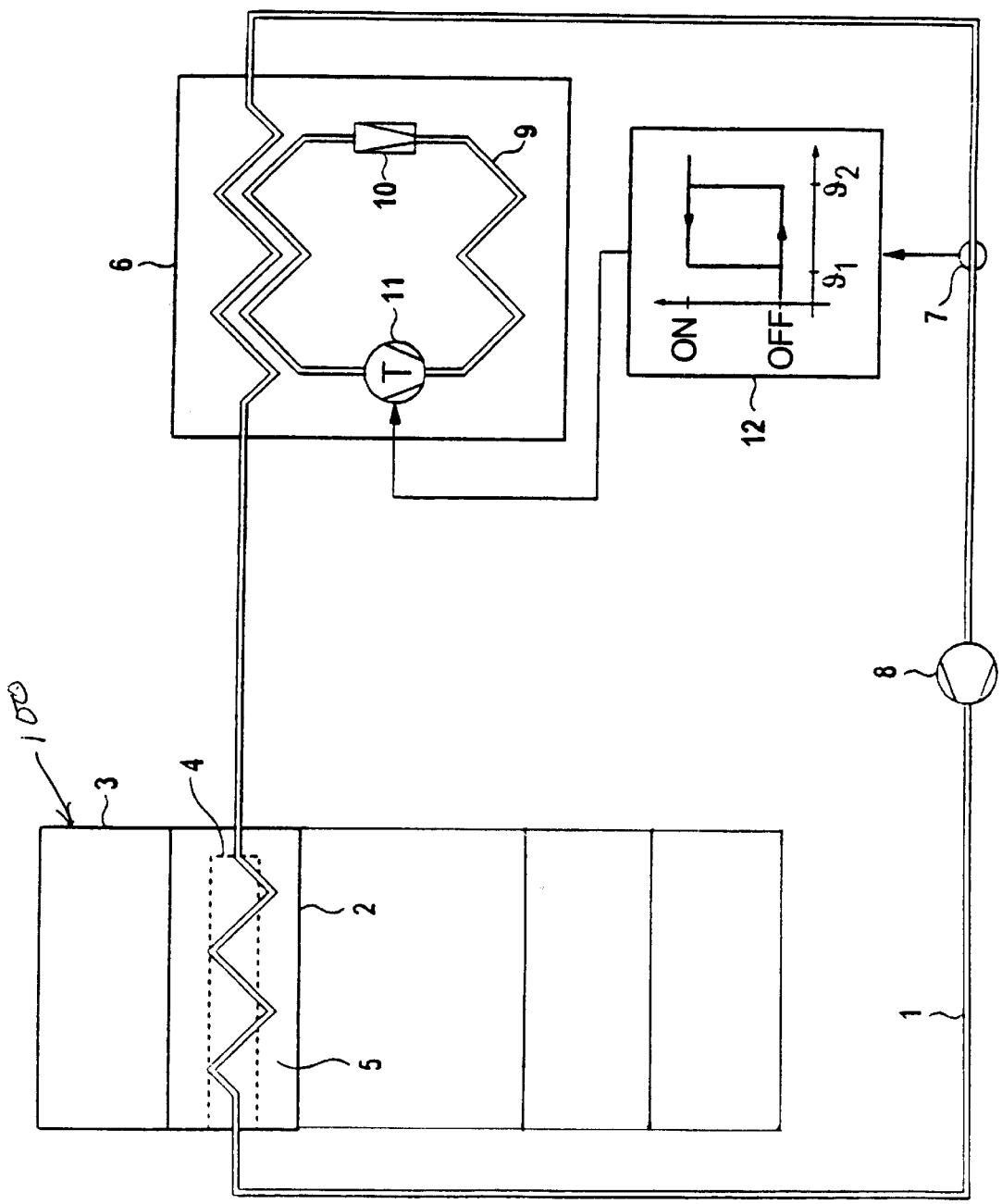
FIG. 1 is a single-circuit cooling circulation system for a gradient coil system having a heat exchanger that contains a refrigeration system.

An exemplary embodiment of the invention is illustrated in FIG. 1 by a single-circuit cooling circulation system 1 operated with a cooling fluid for a gradient coil system 2 of a magnetic resonance apparatus generally indicated at 100. The gradient coil system 2, in addition to containing electrical conductors 4 of gradient coils, of which only one interconnect thereof is shown with broken lines, and a casting resin casing 5 that contains cooling channels for the passage of a cooling fluid. The gradient coil system 2 is directly arranged at a basic field magnet that is implemented as a permanent magnet 3. The cooling circulation system 1 contains, among other things, a heat exchanger 6 for outputting absorbed heat of the gradient coil system 2 to the air of an interior space containing a temperature sensor 7 for a run-up temperature of the cooling fluid as well as a pump 8 that effects a constant flow rate of the cooling fluid. The heat exchanger 6 contains a refrigeration system 9 that withdraws heat from the cooling circulation system 1 and correspondingly outputs it to the ambient air of the interior. The refrigeration system 9 thereby contains an expansion valve 10 as well as a refrigeration compressor 11.

As already initially described, it must be assured for the permanent magnet 3 that the working temperature remains, for example, in a temperature band whose width is prescribed, for example, in the center frequencies of the magnetic resonance signals that are registered at the time spacing of ten minutes deviating from one another by no more than 20 Hz. Since the gradient coil system 2 is immediately arranged in the permanent magnet 3, this demand is to be transferred to the adjoining surfaces of the gradient coil system 2. Particularly as a result of the casting resin 5, the gradient coil system 2 has a high average heat capacity. The casting resin 5 that surrounds the conductors 4 of the gradient coil system 2 thereby exhibits a specific heat capacity of approximately 1.7 J/gK. This means that both a heating as a consequence of a flow of current in the conductors 4 of the gradient coil system as well as a cooling by the cooling fluids effect only a time-delayed and attenuated heating or, respectively, cooling of the surface of the gradient coil system 2. As a result thereof, it becomes possible, among other things, to allow a greater heating as a consequence of the flow of current in the inside of the gradient coil system 2 and to simultaneously allow a greater cooling by the cooling fluid than prescribed by the temperature band at the surface of the gradient system 2.

The cooling circulation system 1 also contains a two-point regulator 12 to which the run-up temperature of the cooling fluid is supplied by a temperature sensor 7 as a regulating variable and the regulator 12 controls the turning on and turning off of a cold compressor 11 as a manipulated variable. For achieving a high-frequency on/off switching clock for the compressor 11, a switching difference between a lower boundary run-up temperature $\theta_1$ and an upper limit run-up temperature $\theta_2$ is set correspondingly small. For adhering to the surface temperature of the gradient coil system 2 prescribed by the temperature band, partial heating or, respectively, cooling that proceeds beyond the above-mentioned temperature band are allowable within the gradient coil system as long as an adequate elimination of the heat generated in the gradient coil system 2 is assured by the adequately high-frequency on/off switching clock of the cooling circulation system 1.

Figure 2:
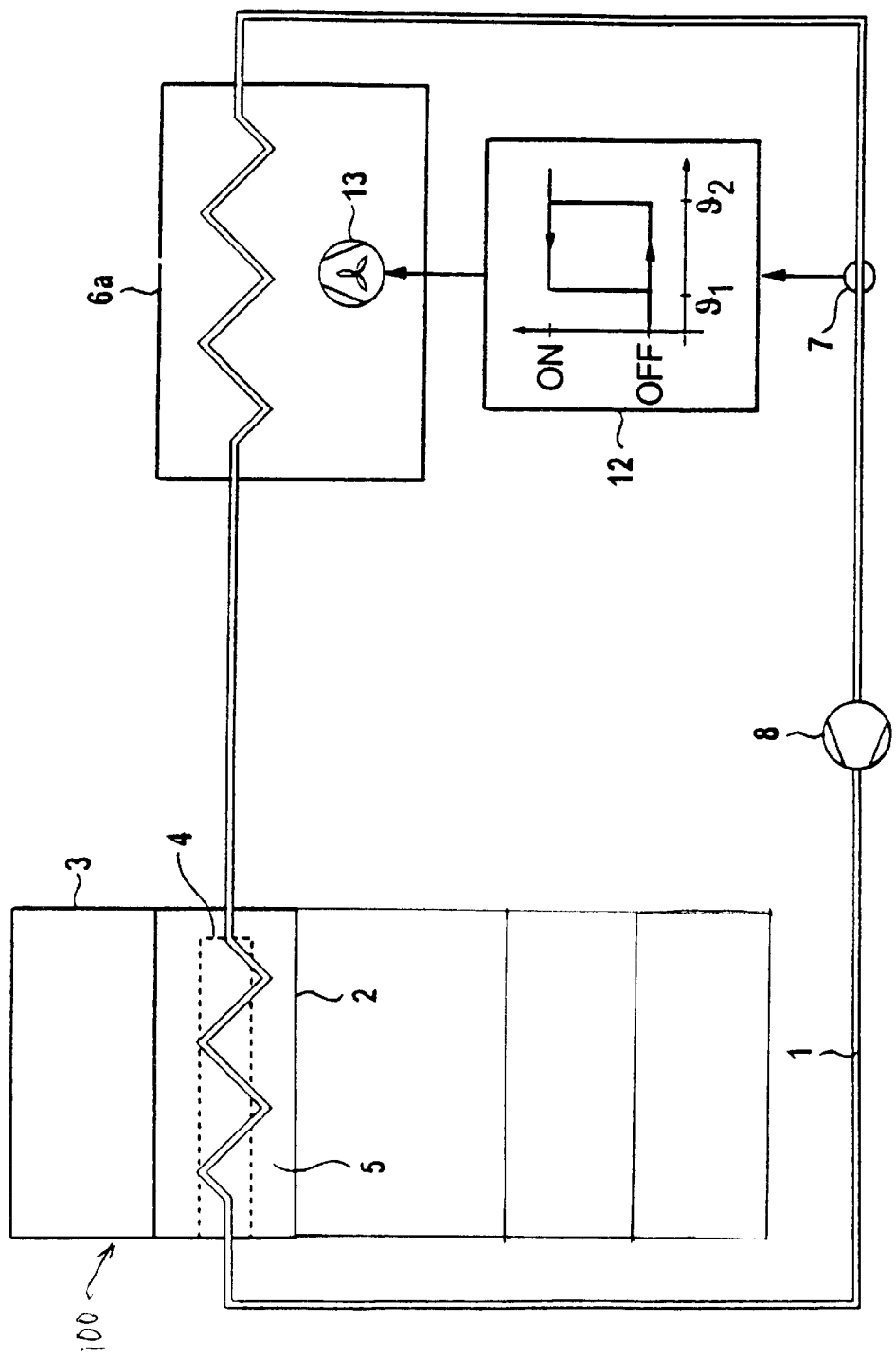
FIG. 2 is a single-circuit cooling circulation system for a gradient coil system having a directly air-cooled heat exchanger.

As a further exemplary embodiment of the invention, FIG. 2 shows a single-circuit cooling circulation system 1 for a gradient coil system 2 of the magnetic resonance apparatus 100 that contains a directly air-cooled heat exchanger 6a. The heat exchanger 6a shown in FIG. 2 differs from the heat exchanger 6 shown in FIG. 1 only in that the heat exchanger 6a does not contain the refrigeration system 9 but, instead, contains a ventilator or fan 13 that is controlled by the two-point regulator 12. Otherwise, the cooling systems shown in FIGS. 1 and 2 are identical.

Figure 3:
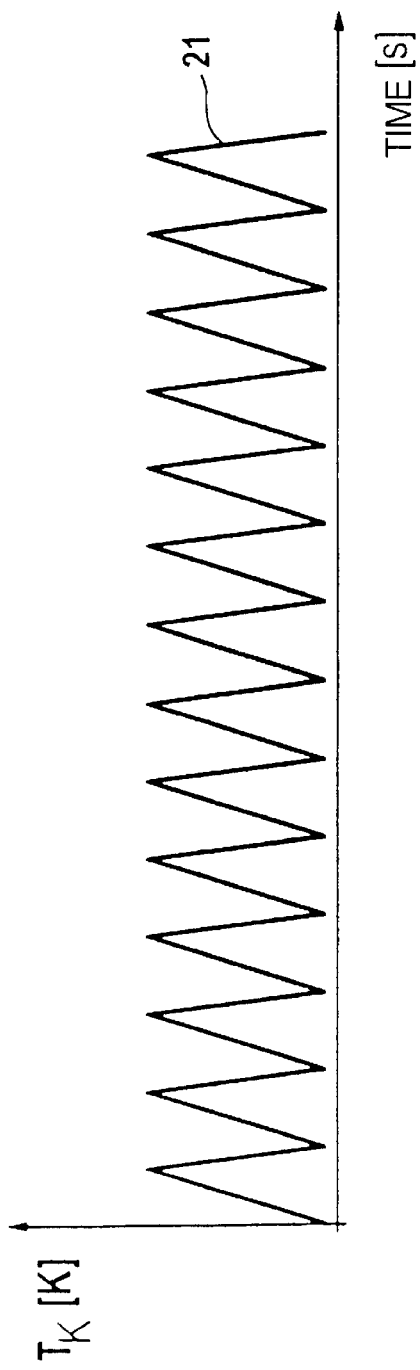
FIG. 3 is a time curve of the run-up temperature for the cooling circulations according to FIGS. 1 and 2.
Figure 4:
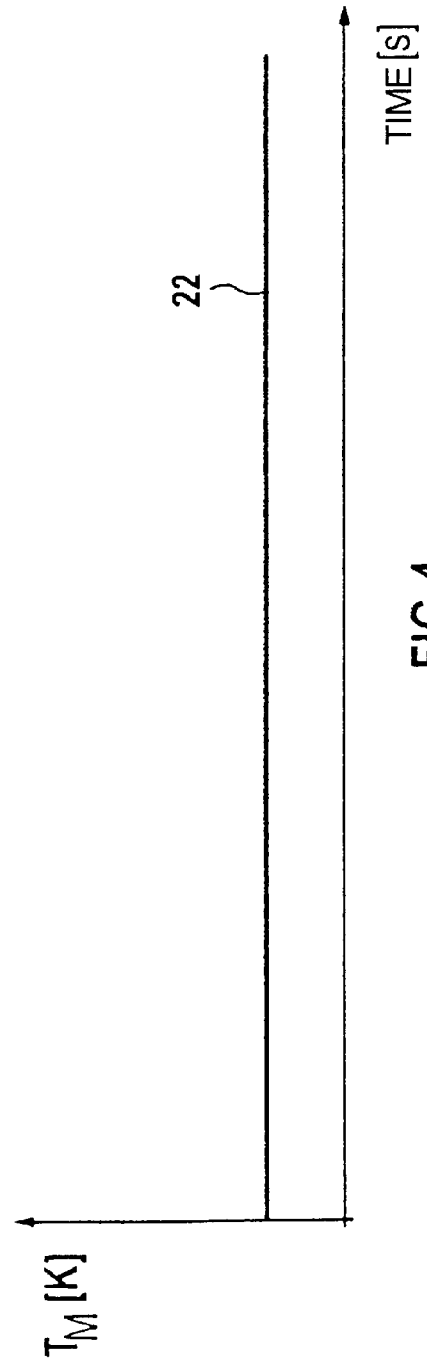
FIG. 4 is a time curve of the temperature at a surface of the gradient coil system for the cooling circulation systems according to FIGS. 1 and 2.

FIGS. 3 and 4 show a time curve 21 of the run-up temperature $T_K$ as well as a time curve 22 of the temperature $T_M$ of the surface of the gradient coil system 2, which is identical to the temperature at the permanent magnet 3, for a cooling circulation system 1 shown in either FIG. 1 or 2. On the basis of the run-up temperature $T_K$, FIG. 3 reveals a comparative high-frequency on/off switching clock of the cooling circulation system 1 as well as the comparatively broad operating temperature range of the cooling fluid which proceeds beyond the temperature prescribed by the permanent magnet 3. As a result thereof, a constant curve 22 occurs, as desired, for the temperature $T_M$ in the ideal case.

Figure 5:
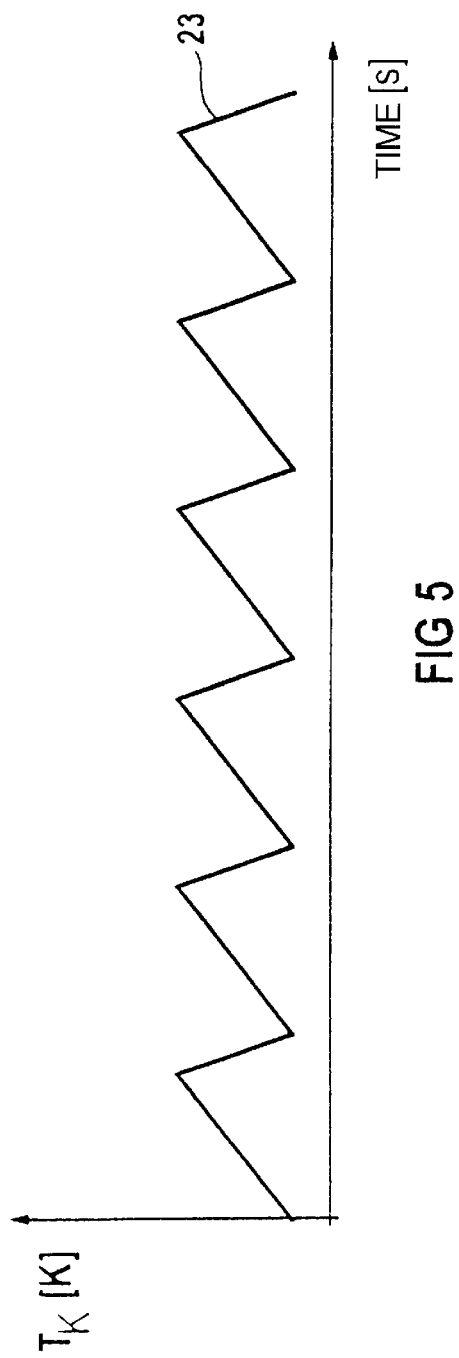
FIG. 5 is a time curve of a run-up temperature of a traditional fluid cooling circulation system for comparison purposes.
Figure 6:
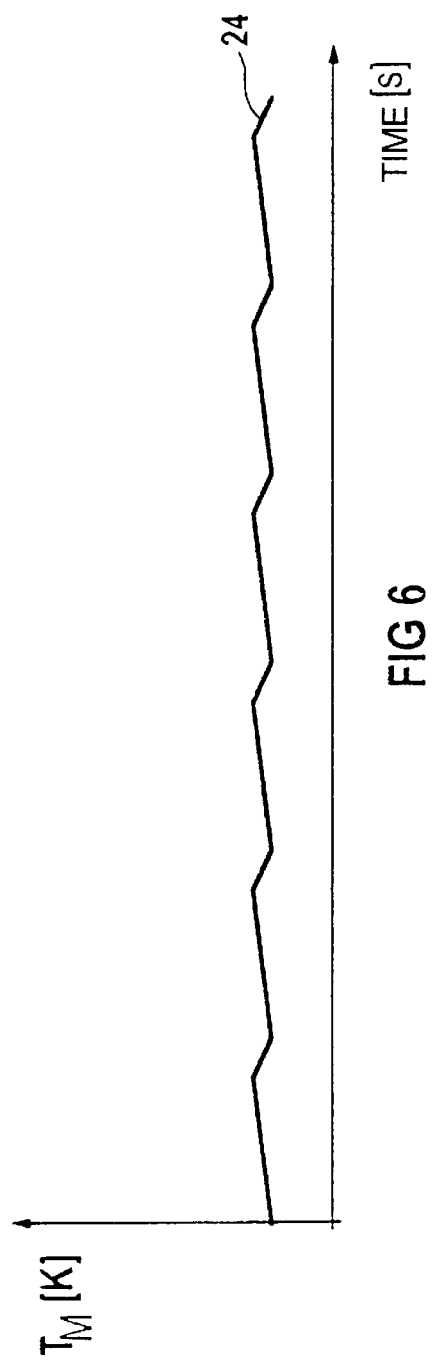
FIG. 6 is a time curve of the temperature at the surface of the gradient coil system for a traditional fluid cooling circulation system for comparison purposes.

For comparative purposes, FIGS. 5 and 6 show curves 23 and 24, which correspond to FIGS. 3 and 4, of a traditional cooling circulation system that, as a result of different dimensioning connected with a comparatively low-frequency on/off switching clock as well as a comparatively low operating temperature range of a cooling fluid, produces an undesirable, temporally changing temperature $T_M$ at the permanent magnet.

Although various minor modifications may be suggested by those versed in the art, it should be understood that I wish to embody within the scope of the patent granted hereon all such modifications as reasonably and properly come within the scope of my contribution to the art.

I claim:

1. A magnetic resonance apparatus comprising a single-circuit cooling circulation system operated with a coolant for cooling a gradient coil system so that the temperature of at least one surface of the gradient coil system remains within a temperature range, which is tolerated by a patient, said cooling circulation system having a performance range corresponding to an average ohmic dissipated power of the gradient coil system, the cooling circulation system containing a heat exchanger that can at least be switched on and off, the heat exchanger having a high-frequency on/off switching clock, the gradient coil system having a high average specific heat capacity and the coolant having an operating temperature range proceeding beyond the predetermined temperature range.

2. A magnetic resonance apparatus according to claim 1, wherein the period of the on/off switching clock is less than ten minutes.

3. A magnetic resonance apparatus according to claim 1, wherein the average specific heat capacity is greater than approximately 1 J/gK.

4. A magnetic resonance apparatus according to claim 1, wherein the gradient coil system comprises a casing of casting resin.

5. A magnetic resonance apparatus according to claim 1, wherein the heat exchanger is an air-cooled heat exchanger of an indoor installation.

6. A magnetic resonance apparatus according to claim 1, wherein the heat exchanger contains a ventilator that is fashioned at least to be switched on and off.

7. A magnetic resonance apparatus according to claim 1, wherein the heat exchanger contains a refrigeration system that contains a refrigeration compressor that is constructed at least to be switched on and off.

8. A magnetic resonance apparatus according to claim 1, wherein the coolant is a cooling fluid.

9. A magnetic resonance apparatus according to claim 8, wherein the cooling fluid is water.

10. A magnetic resonance apparatus according to claim 1, wherein the cooling circulation system contains a temperature sensor for determining a run-up temperature, the cooling circulation system includes a two-point regulator for regulating variables in the run-up temperature and for manipulating variables and which operates the on/off switching of the heat exchanger and the two-point regulator comprises a small switching difference for achieving a high-frequency on/off switching clock.

11. A magnetic resonance apparatus according to claim 1, wherein the magnetic resonance apparatus comprises a permanent magnet as a basic field magnet and the gradient coil system is arranged at the permanent magnet.

\* \* \* \* \*